United States Patent
Koyashiki et al.

(10) Patent No.: US 8,514,638 B2
(45) Date of Patent: Aug. 20, 2013

(54) WRITE CONTROL CIRCUIT AND SEMICONDUCTOR DEVICE

(75) Inventors: Tsuyoshi Koyashiki, Yokohama (JP); Jun Nagayama, Yokohama (JP); Masahito Isoda, Yokohama (JP); Tomoharu Awaya, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/316,520

(22) Filed: Dec. 11, 2011

(65) Prior Publication Data

US 2012/0213014 A1 Aug. 23, 2012

(30) Foreign Application Priority Data

Feb. 17, 2011 (JP) ................................. 2011-031810
Feb. 17, 2011 (JP) ................................. 2011-031812

(51) Int. Cl.
*G11C 7/00* (2006.01)
(52) U.S. Cl.
USPC ............ 365/189.16; 365/189.18; 365/189.19; 365/185.21; 365/185.22
(58) Field of Classification Search
USPC ........... 365/189.016, 189.18, 189.19, 189.21, 365/189.22, 189.16, 185.21, 185.22
See application file for complete search history.

(56) References Cited

U.S. PATENT DOCUMENTS

| | | | | |
|---|---|---|---|---|
| 7,002,846 | B2 * | 2/2006 | Okimoto et al. | 365/185.19 |
| 7,768,832 | B2 * | 8/2010 | Roohparvar et al. | 365/185.17 |
| 7,924,624 | B2 * | 4/2011 | Kim et al. | 365/185.22 |
| 8,223,555 | B2 * | 7/2012 | Kim et al. | 365/185.22 |
| 2008/0123427 | A1 * | 5/2008 | Hsu | 365/185.21 |
| 2009/0189226 | A1 | 7/2009 | Yamamoto et al. | |

FOREIGN PATENT DOCUMENTS

| | | |
|---|---|---|
| JP | 53-7142 A | 1/1978 |
| JP | 8-321197 A | 12/1996 |
| JP | 2009-157981 A | 7/2009 |
| JP | 2009-177044 A | 8/2009 |

* cited by examiner

*Primary Examiner* — Connie Yoha
(74) *Attorney, Agent, or Firm* — Fujitsu Patent Center

(57) ABSTRACT

In a semiconductor device and a write control circuit, a voltage detection unit detects a write voltage supplied to a storage element (electrical fuse element) in which only single writing is electrically performed and, when the write voltage is equal to or more than a predetermined threshold voltage, allows the write control unit to stop writing to the electrical fuse element regardless of the write signal. The above processing permits the write control circuit to suppress false writing caused by the fact that abnormality occurs in a write voltage and it becomes an overvoltage.

11 Claims, 15 Drawing Sheets

WRITE CONTROL CIRCUIT AND SEMICONDUCTOR DEVICE

CROSS-REFERENCE TO RELATED APPLICATIONS

This application is based upon and claims the benefit of priority of the prior Japanese Patent Application No. 2011-031810, filed on Feb. 17, 2011 and the Japanese Patent Application No. 2011-031812, filed on Feb. 17, 2011, the entire contents of which are incorporated herein by reference.

FIELD

The embodiment discussed herein is related to a write control circuit and a semiconductor device which control writing to a storage element in which only single writing is electrically performed.

BACKGROUND

In recent years, in a random access memory (RAM) circuit, redundancy processing used for relief of a defective bit or an electrical fuse element used for an identification number for identifying each chip increases.

The electrical fuse element is a storage element (hereinafter, referred to as one time programming (OTP) element) in which only single writing is electrically performed. The electrical fuse element is connected to a terminal to which a predetermined write voltage is applied and a write transistor. When the predetermined write voltage is applied and the write transistor is kept in an on state by a signal for controlling writing as in a write enable (WE) signal, a current flows through the electrical fuse element. This current permits the electrical fuse element to be broken and placed in a write state.

Conventionally, there is used a technology in which in order that a voltage in a write line may be prevented from rising up upon a fuse as a write object being broken, the other fuses also may be prevented from being broken, and false writing may be prevented from occurring, a voltage in a write line is clamped so as not to be equal to or more than a fixed voltage.

Also, there is known a technology in which in order that false break of an electrical fuse element may be prevented during occurrence of electrostatic discharge (ESD), a diode for flowing a surge current of ESD is provided to prevent an inflow of a surge current to the electrical fuse element.
Japanese Laid-open Patent publication No. 53-007142
Japanese Laid-open Patent publication No. 2009-177044
Japanese Laid-open Patent publication No. 2009-157981
Japanese Laid-open Patent publication No. 08-321197

When some unintentional current flows through the above-described OTP element, false writing may occur.

For example, when abnormality occurs in a write voltage and it becomes an overvoltage, an influence may be exerted also on a signal for controlling a write transistor. In this case, even when a writing operation is not performed, the write transistor cannot be kept in an off state by a false operation of a circuit for controlling itself. As a result, an unintentional current may flow through the above-described OTP element.

SUMMARY

According to one aspect of the present invention, a write control circuit includes a write control unit configured to control, according to a write signal, writing to a storage element in which only single writing is electrically performed; and a voltage detection unit configured to detect a write voltage supplied to the storage element, and when the write voltage is equal to or more than a predetermined threshold voltage, allow the write control unit to stop writing to the storage element regardless of the write signal.

The object and advantages of the invention will be realized and attained by means of the devices and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
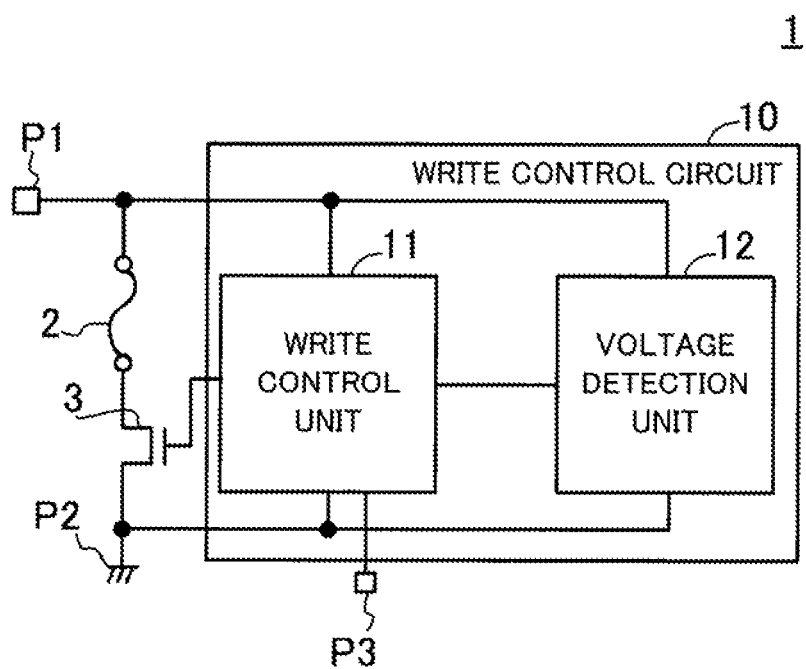
FIG. 1 illustrates one example of a semiconductor device and a write control circuit according to a first embodiment.

Preferred embodiments of the present invention will now be described in detail below with reference to the accompanying drawings, wherein like reference numerals refer to like elements throughout.

An example of an electrical fuse element will be described below as an OTP element electrically performing writing; however, it is not limited thereto. For example, there may be used the OTP element in which a high voltage is applied to a gate oxide film of a transistor and the gate oxide film is electrically broken and which is placed in a write state.

First Embodiment

FIG. 1 illustrates one example of a semiconductor device and a write control circuit according to a first embodiment.

The illustrated semiconductor device 1 includes an electrical fuse element 2, a write transistor 3, and a write control circuit 10. Further, the write control circuit 10 has a write control unit 11 and a voltage detection unit 12.

The electrical fuse element 2 and the write transistor 3 are connected, for example, between a terminal P1 to which a write voltage is applied from a tester circuit (not illustrated) and an earth terminal P2 having a ground potential (reference potential).

Examples of the electrical fuse element 2 include an element using a silicide layer formed on a polysilicon layer and a metal fuse. In the case where a resistance value of the electrical fuse element 2 is 200Ω and it is broken upon a current of 10 mA flowing, for example, a voltage of approximately 3 V is applied as the write voltage.

The write transistor 3 receives a control signal from the write control unit 11, and controls whether to flow a current through the electrical fuse element 2. Referring to an example of FIG. 1, an n channel metal-oxide semiconductor field effect transistor (MOSFET) is used as the write transistor 3.

Referring again to an example of FIG. 1, one terminal of the electrical fuse element 2 is connected to the terminal P1 to which the write voltage is applied and the other terminal is connected to one input and output terminal (drain) of the write transistor 3. The other input and output terminal (source) of the write transistor 3 is connected to the earth terminal P2 having a ground potential, and a control signal from the write control unit 11 is supplied to a control terminal (gate).

In the write control circuit 10, the write control unit 11 controls writing to the electrical fuse element 2, for example, according to a write signal supplied via a terminal P3 from a tester circuit (not illustrated). According to a write enable (WE) signal being a write signal, for example, the write control unit 11 generates a control signal for turning on or off the write transistor 3 to control writing to the electrical fuse element 2. The write control unit 11 is driven by a write voltage to be supplied from the terminal P1. Further, the write control unit 11 is connected also to the earth terminal P2 having a ground potential.

The voltage detection unit 12 is connected to the terminal P1 and the earth terminal P2, and detects a write voltage supplied to the electrical fuse element 2. When the write voltage is equal to or more than a predetermined threshold voltage, the voltage detection unit 12 allows the write control unit 11 to stop writing to the electrical fuse element 2 regardless of a write signal supplied to the write control unit 11. Referring to an example of FIG. 1, the voltage detection unit 12 transmits to the write control unit 11 a signal for fixing a control terminal of the write transistor 3 to a potential of a low (L) level (a detail will be described later).

An example of the threshold voltage will be described later, and when the write voltage is equal to 3 V, the threshold voltage is set to, for example, 3.3 V.

The above-described write control circuit 10 can keep the write transistor 3 in an off state and prevent false writing even if the write voltage becomes an overvoltage being equal to or more than a predetermined threshold voltage.

During the power-on of the write voltage or operation of an adjacent circuit, for example, when abnormality occurs in the write voltage and it becomes an overvoltage, abnormality may occur also in a write signal supplied from the terminal P3 due to noise along with the overvoltage. For example, when the writing is performed by a write signal of a pulse having a high (H) level for a fixed period of time, abnormality of waves occurs in the write signal due to an overvoltage. Although the writing should not be performed, when the write signal has an H level, the false writing may occur. Further, at the time when the write voltage becomes an overvoltage, when the electrical fuse element 2 is placed in a write state, a large amount of current flows through the electrical fuse element 2 and it may be placed in an overwrite state.

However, according to the write control circuit 10 of the present embodiment, when the write voltage becomes an overvoltage and is equal to or more than a predetermined threshold voltage, the voltage detection unit 12 allows the write control unit 11 to stop writing to the electrical fuse element 2 regardless of the write signal. Referring to an example of FIG. 1, the voltage detection unit 12 fixes a control signal supplied to a control terminal of the write transistor 3 from the write control unit 11 to an L level.

Through the above processing, even if the write voltage becomes an overvoltage being equal to or more than a predetermined threshold voltage, the write control circuit 10 can keep the write transistor 3 in an off state, and prevent a current from flowing through the electrical fuse element 2 and it from being broken, thereby suppressing the false writing and overwriting.

An example of the write control circuit 10 will be described in more detail below as second and third embodiments.

Second Embodiment

Figure 2:
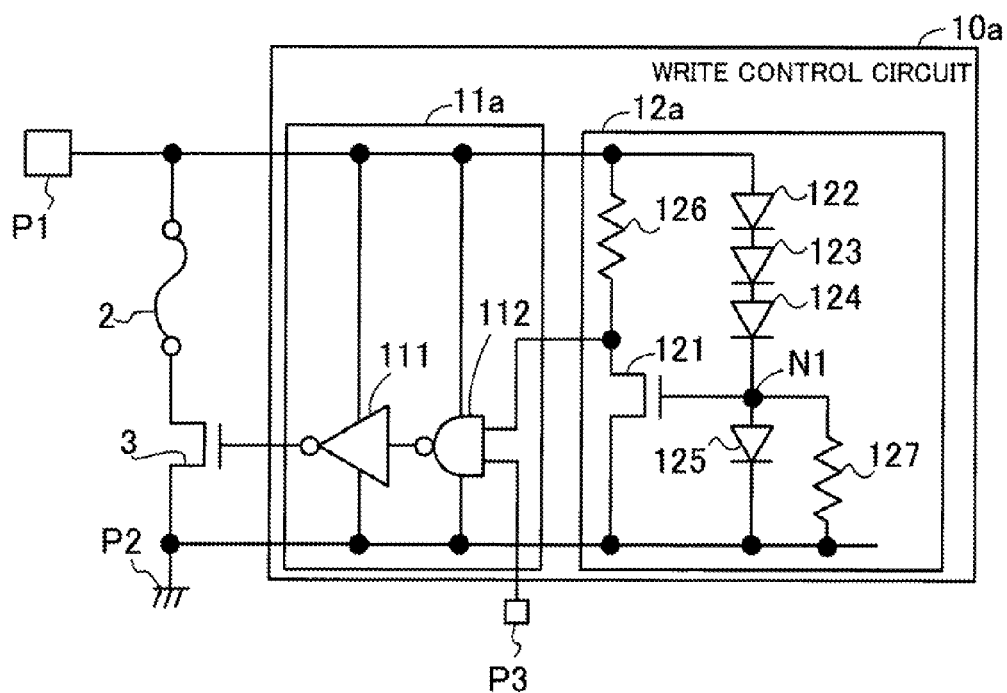
FIG. 2 illustrates an example of a semiconductor device and a write control circuit according to a second embodiment.

FIG. 2 illustrates an example of a semiconductor device and a write control circuit according to a second embodiment.

The same circuit elements as those of the semiconductor device 1 according to the first embodiment are indicated by the same reference numerals as in the first embodiment, and the description will not be repeated here.

In the semiconductor device 1a according to the second embodiment, a write control circuit 10a includes a write control unit 11a and a voltage detection unit 12a.

The write control unit 11a has an inverter circuit 111 and a NAND circuit 112.

The inverter circuit 111 inverts a signal level of an output signal from the NAND circuit 112, and outputs it as a control signal of the write transistor 3.

The NAND circuit 112 supplies a NAND logic between an output signal from the voltage detection unit 12a and a write signal from the terminal P3. In the case where the write voltage is equal to or more than a threshold voltage, the NAND circuit 112 cancels out the write signal by using an output signal having an L level produced from the voltage detection unit 12a. That is, the NAND circuit 112 supplies a signal having an H level regardless of the write signal.

In addition, the inverter circuit 111 and the NAND circuit 112 are connected between the terminal P1 and the earth terminal P2, and driven by the write voltage, respectively.

The voltage detection unit 12a sets the above-described threshold voltage based on the number of multiple series-connected diodes between the terminal P1 and the earth terminal P2, and the forward voltage of the diodes. Referring now to an example of FIG. 2, the voltage detection unit 12a has a transistor 121, diodes 122, 123, 124, and 125, and resistors 126 and 127.

Referring again to an example of FIG. 2, the transistor 121 is an n channel MOSFET, a drain is connected to the terminal P1 via the resistor 126, and a source is connected to the earth terminal P2. A gate (control terminal) is connected between the multiple diodes 122 to 125. Referring to an example of FIG. 2, the gate is connected to a node N1 between a cathode of the diode 124 and an anode of the diode 125.

The diodes 122 to 125 are serially connected between the terminal P1 and the earth terminal P2. For example, when a forward voltage Vf of the respective diodes 122 to 125 is set to 0.8 V, the above-described threshold voltage is equal to 0.8×4=3.2 V.

The resistor 126 adjusts an output voltage from the voltage detection unit 12a and, for example, a resistor having a resistance value approximately one hundred times as large as that of the on-resistance of the transistor 121 is used.

In the resistor 127, one terminal is connected to the node N1, and the other terminal is connected to the earth terminal P2. The resistor 127 is provided in order to drop a potential of the node N1 to the ground potential so that the potential fails to be placed in a floating state when the diodes 122 to 125 are kept in an off state. In addition, as the resistor 127, for example, a resistor having a resistance value sufficiently large (e.g., approximately one hundred times) to that of the on-resistance of the diode 125 is used.

Operations of the semiconductor device 1a according to the second embodiment will be described below.

In the case where the write voltage is applied to the terminal P1, for example, the forward voltage Vf of each of the diodes 122 to 125 is set to 0.8 V. At this time, in the case where the write voltage is not approximately 3.2 V or more, the diodes 122 to 125 are kept in an off state, and a current hardly flows. Therefore, a potential of the node N1 has an L level. At this time, since the transistor 121 is kept in an off state, an output signal from the voltage detection unit 12a taken out from the drain of the transistor 121 has an H level.

To the write control unit 11a, in the case where an output signal having an H level is supplied from the voltage detection unit 12a, when the write signal has an H level, an output signal from the NAND circuit 112 has an L level, and an output signal from the inverter circuit 111 has an H level. Through the above processing, the write transistor 3 turns on, a current flows due to the write voltage, and the writing to the electrical fuse element 2 is performed. In the case where the write signal has an L level, an output signal from the NAND circuit 112 has an H level, and an output signal from the inverter circuit 111 has an L level. At this time, the write transistor 3 is kept in an off state, and the writing to the electrical fuse element 2 is stopped.

When the write voltage becomes approximately 3.2 V or more, the diodes 122 to 125 turn on and a current flows in the voltage detection unit 12a. Further, the transistor 121 turns on due to a voltage applied to the diode 125 and the resistor 127.

In the case where a resistance value of the resistor 127 is sufficiently large to that of the on-resistance of the diode 125, the transistor 121 approximately turns on due to the forward voltage Vf (e.g., 0.8 V) of the diode 125.

When the transistor 121 turns on, an output signal from the voltage detection unit 12a taken out from the drain of the transistor 121 has an L level. This output signal is a signal for canceling out the write signal.

That is, the NAND circuit 112 of the write control unit 11a supplies an output signal having an H level regardless of a state of the write signal. At this time, since an output signal from the inverter circuit 111 has an L level, the write transistor 3 is kept in an off state and the writing to the electrical fuse element 2 is stopped.

Figure 3:
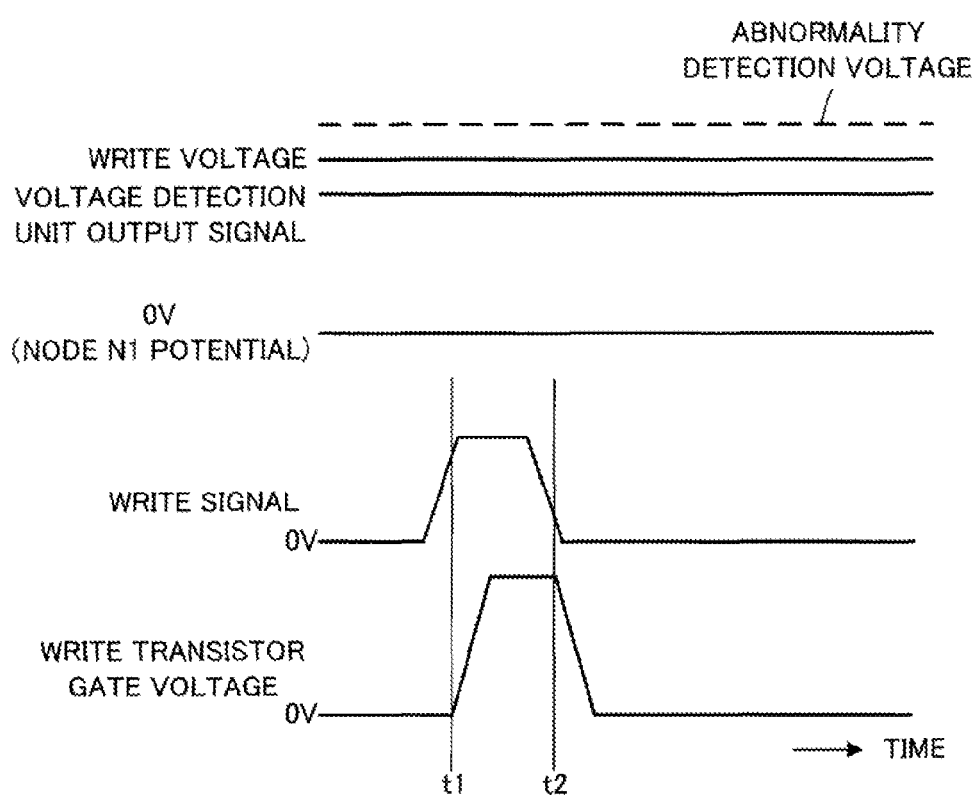
FIG. 3 illustrates one example of a signal waveform of each unit during a writing operation of a semiconductor device in the case where a write voltage is normal.

FIG. 3 illustrates one example of a signal waveform of each unit during a writing operation of the semiconductor device in the case where the write voltage is normal.

The horizontal axis represents the time, and the vertical axis represents the voltage. From the above, there are illustrated the abnormality detection voltage (the above-described threshold voltage), the write voltage, the output signal from the voltage detection unit 12a, the potential of the node N1, the write signal, and the gate voltage of the write transistor 3.

In the case of the writing detection circuit 10a illustrated in FIG. 2, the abnormality detection voltage is, for example, 3.2 V. In the case where the write voltage is normal, it is smaller than the abnormality detection voltage as illustrated in FIG. 3. Further, since the diodes 122 to 125 are kept in an off state, a potential of the node N1 becomes 0 V. For that reason, the transistor 121 is kept in an off state, and an output voltage from the voltage detection unit 12a has an H level.

In this state, in the case where the write signal has an L level, a gate voltage of the write transistor 3 becomes 0 V based on operations of the above-described NAND circuit 112 and inverter circuit 111. Therefore, the write transistor 3 is kept in an off state, and the writing to the electrical fuse element 2 fails to be performed.

When the write signal has an H level (timing t1 of FIG. 3), since an output signal from the NAND circuit 112 is inverted to an L level, a gate voltage of the write transistor 3 has an H level. Therefore, the write transistor 3 is kept in an on state, and a current flows therethrough. As a result, the writing to the electrical fuse element 2 is performed. That is, break of the electrical fuse element 2 is started.

After the definite period of time, when the write signal falls to an L level (0 V) (timing t2), since an output signal from the NAND circuit 112 is inverted to an H level, a gate voltage of the write transistor 3 has an L level. Therefore, the write transistor 3 is kept in an off state and a current is cut off. As a result, the writing to the electrical fuse element 2 is finished.

Figure 4:
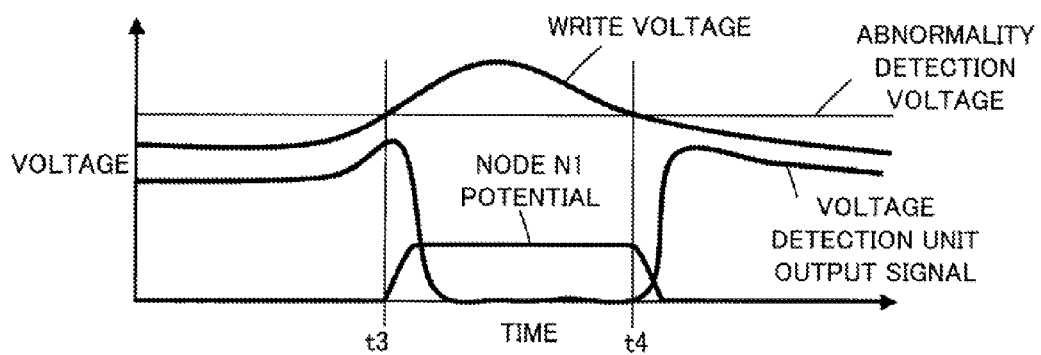
FIG. 4 illustrates one example of an appearance of a signal of a voltage detection unit in the case where a write voltage becomes an overvoltage.

FIG. 4 illustrates one example of an appearance of a signal of the voltage detection unit in the case where the write voltage becomes an overvoltage.

The horizontal axis represents the time, and the vertical axis represents the voltage.

When the write voltage is equal to or more than an abnormality detection voltage (timing t3 of FIG. 4), the diodes 122 to 125 turn on, a potential of the node N1 is a voltage (e.g., approximately 0.8 V) approximately equivalent to the forward voltage Vf of the diode 125. Through the above processing, the transistor 121 turns on, and an output signal from the voltage detection unit 12a has an L level.

Through the above processing, regardless of a state of the write signal, the write control unit 11a keeps the write transistor 3 in an off state and prevents it from performing writing to the electrical fuse element 2.

When the write voltage becomes smaller than the abnormality detection voltage (timing t4), the diodes 122 to 125 are kept in an off state, and a potential of the node N1 falls to 0 V. Through the above processing, the transistor 121 is kept in an off state, and an output signal from the voltage detection unit 12a has an H level. The write control unit 11a performs writing according to a state of the write signal.

As can be seen from the above discussion, when abnormality occurs in the write voltage and it is equal to or more than a predetermined threshold voltage (abnormality detection voltage), the write control circuit 10a of the second embodiment stops the writing to the electrical fuse element 2 regardless of a state of the write signal. This process permits the write control circuit 10a to prevent the false writing.

Further, when the threshold voltage is set by using multiple series-connected diodes, a circuit scale can be reduced.

Referring now to an example of FIG. 2, a case where four diodes 122 to 125 are provided is described. The number of diodes can be appropriately changed according to the threshold voltage to be set or forward voltage Vf of diodes.

Referring to an example of FIG. 2, when the respective diodes 122 to 125 turn on and a forward current flows, the write control circuit 10a is designed so that the transistor 121 turns on due to a voltage applied to the diode 125; however, it is not limited thereto. A position in which a control terminal of the transistor 121 is connected between the diodes 122 to 125 may be appropriately changed according to the forward voltage Vf of the diodes 122 to 125 so that when the diodes 122 to 125 turn on, the transistor 121 also turns on.

Third Embodiment

Figure 5:
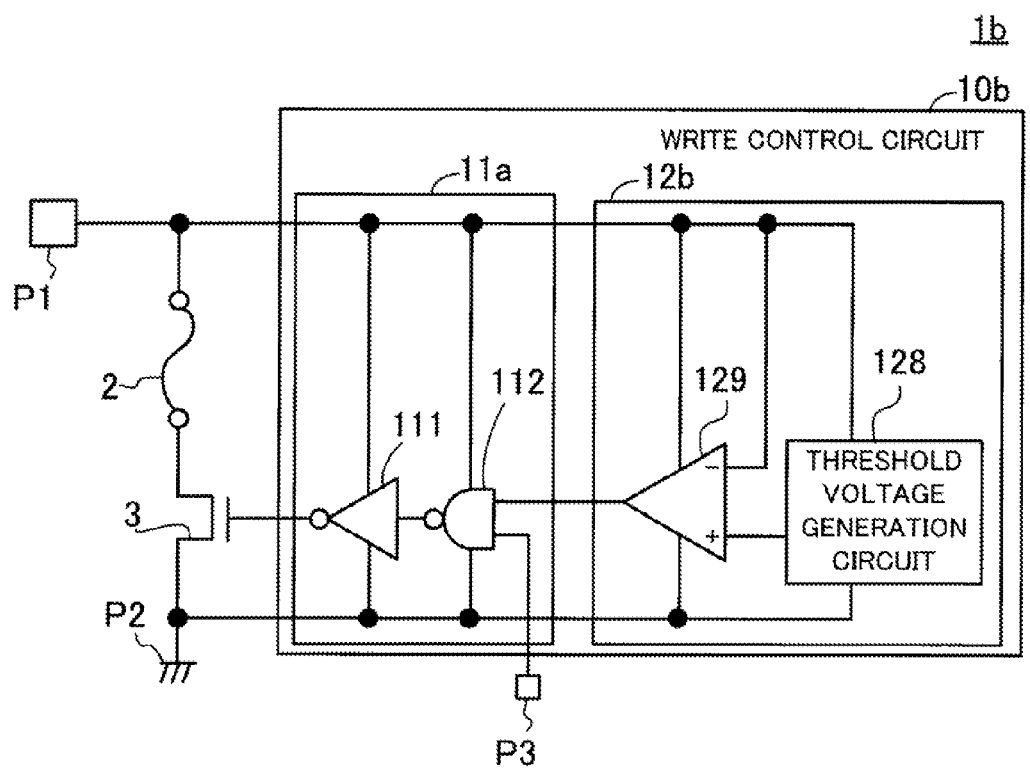
FIG. 5 illustrates one example of a semiconductor device and a write control circuit according to a third embodiment.

FIG. 5 illustrates one example of a semiconductor device and a write control circuit according to a third embodiment.

The same circuit elements as those of the semiconductor device 1a according to the second embodiment of FIG. 2 are indicated by the same reference numerals as in the second embodiment, and the description will not be repeated here.

In the semiconductor device 1b and the write control circuit 10b, a voltage detection unit 12b according to the third embodiment differs from the voltage detection unit 12a according to the second embodiment.

The voltage detection unit 12b has a threshold voltage generation circuit 128 and a comparison circuit 129.

The threshold voltage generation circuit 128 generates a predetermined threshold voltage used for an abnormality detection voltage. The threshold voltage generation circuit 128 includes, for example, a constant-voltage generation circuit obtained by combining multiple transistors, and multiple series-connected diodes or zener diodes as illustrated in FIG. 2, and generates a desired threshold voltage. For example, the threshold voltage generation circuit 128 may have multiple series circuits in which the number of connections of a diode is different, and select any of the series circuits based on a signal from a tester circuit (not illustrated) to adjust the threshold voltage.

A negative input terminal of the comparison circuit 129 is connected to the terminal P1, and a positive input terminal is connected to the threshold voltage generation circuit 128. When the write voltage applied to the terminal P1 is equal to or more than a threshold voltage generated in the threshold voltage generation circuit 128, the comparison circuit 129 supplies a signal for canceling out the write signal to the write control unit 11a. Referring now to an example of FIG. 5, the comparison circuit 129 supplies an output signal having an L level for canceling out the write signal.

The threshold voltage generation circuit 128 and the comparison circuit 129 are connected between the terminal P1 and the earth terminal P2, and driven by the write voltage, respectively.

In the above-described write control circuit 10b, in the case where the write voltage is smaller than the threshold voltage, an output signal from the voltage detection unit 12b has an H level in the same manner as in an operation waveform of the semiconductor device 1a according to the second embodiment of FIG. 3. The write control unit 11a performs writing according to a state of the write signal.

When the write voltage is equal to or more than the threshold voltage produced from the threshold voltage generation circuit 128, the following operations are performed.

Figure 6:
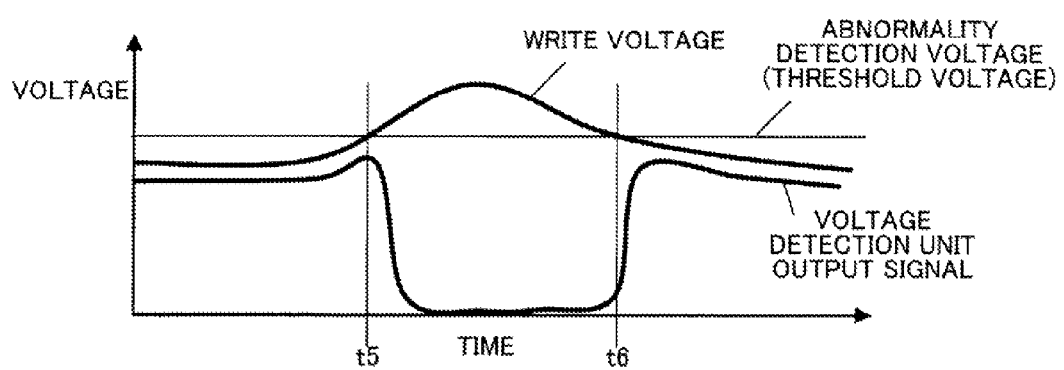
FIG. 6 illustrates one example of an appearance of a signal of a voltage detection unit in the case where a write voltage becomes an overvoltage.

FIG. 6 illustrates one example of an appearance of a signal of the voltage detection unit in the case where the write voltage becomes an overvoltage.

The horizontal axis represents the time, and the vertical axis represents the voltage.

When the write voltage is equal to or more than the abnormality detection voltage (threshold voltage) (timing t5 of FIG. 6), an output signal from the comparison circuit 129, namely, an output signal from the voltage detection unit 12b has an L level.

Through the above processing, regardless of a state of the write signal, the write control unit 11a keeps the write transistor 3 in an off state and prevents it from performing writing to the electrical fuse element 2.

When the write voltage is smaller than the abnormality detection voltage (timing t6 of FIG. 6), an output signal from the comparison circuit 129, namely, an output signal from the voltage detection unit 12b has an H level. The write control unit 11a performs writing according to a state of the write signal.

As can be seen from the above discussion, when abnormality occurs in the write voltage and it is equal to or more than a predetermined threshold voltage (abnormality detection voltage), the write control circuit 10b of the third embodiment stops the writing to the electrical fuse element 2 regardless of a state of the write signal. Therefore, the write control circuit 10b can prevent the false writing.

Further, the threshold voltage generation circuit 128 can set a desired threshold voltage.

In each embodiment described above, for example, multiple electrical fuse elements may be provided. In that case, any one of the write control circuits 10, 10a, and 10b may be provided with respect to respective electrical fuse elements and write transistors.

Further, as the write transistor 3 and the transistor 121, a p channel MOSFET may be used. In that case, a circuit configuration is appropriately changed. In place of the MOSFET, a bipolar transistor may be used.

As another configuration in which multiple electrical fuse elements are provided, the following configuration may be used. That is, any one of the voltage detection units 12, 12a, and 12b is common to respective electrical fuse elements, write transistors, and the write control units in the write control circuit.

Fourth Embodiment

In an OTP element in which writing is electrically performed, a write transistor turns on in the case of unstable signals such as during the power-on of the write voltage or power supply voltage. In the above-described case, there is a possibility that an appropriate current fails to flow through an electrical fuse element, overwriting is performed, and writing is performed in a halfway manner. In that case, false writing is performed and quality in the writing is deteriorated.

A write control circuit and a semiconductor device according to a fourth embodiment suppress the above-described false writing.

Figure 7:
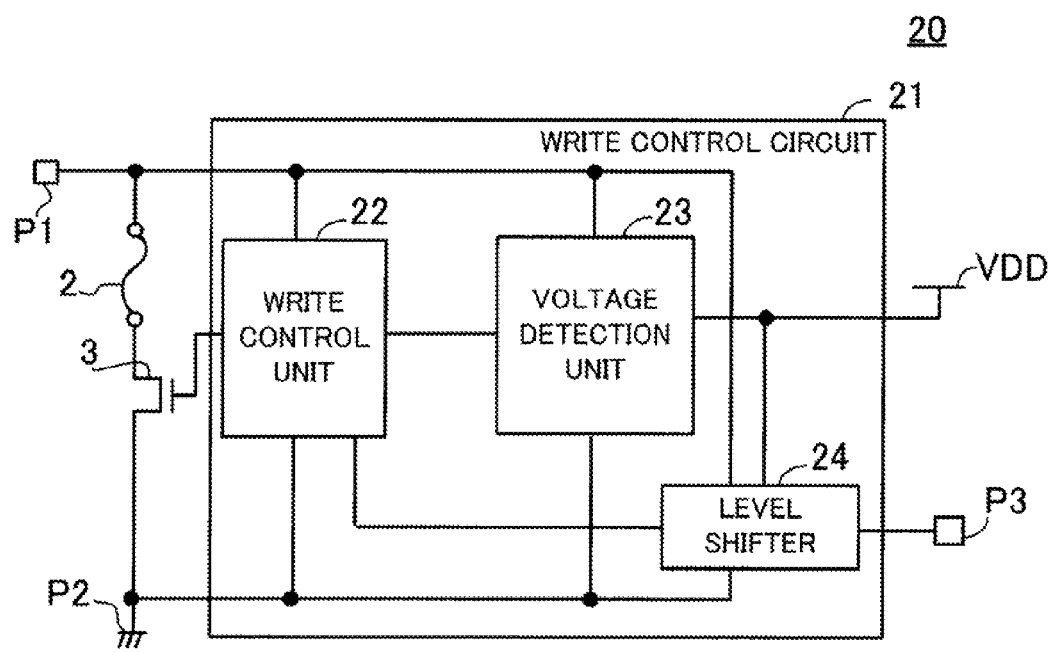
FIG. 7 illustrates one example of a semiconductor device and a write control circuit according to a fourth embodiment.

FIG. 7 illustrates one example of the semiconductor device and the write control circuit according to the fourth embodiment.

The same circuit elements as those of the semiconductor device 1 according to the first embodiment are indicated by the same reference numerals as in the first embodiment, and the description will not be repeated here.

In a semiconductor device 20, a write control circuit 21 includes a write control unit 22, a voltage detection unit 23, and a level shifter 24.

In the write control circuit 21, the write control unit 22 controls writing to the electrical fuse element 2 according to a write signal (e.g., a write enable signal) which is supplied from a tester circuit (not illustrated) via the terminal P3 and boosted by the level shifter 24. According to the supplied write signal, the write control unit 22 generates a control signal for turning on or off the write transistor 3 to control writing to the electrical fuse element 2. The write control unit 22 is driven by a write voltage supplied from the terminal P1. Further, the write control unit 22 is connected also to the earth terminal P2.

The voltage detection unit 23 is connected to the terminal P1, VDD, and earth terminal P2, and detects the write voltage and power supply voltage supplied to the electrical fuse element 2. At the rising of the power supply voltage or write voltage, the voltage detection unit 23 allows the write control unit 22 to stop writing to the electrical fuse element 2 for a fixed period of time regardless of a write signal supplied to the write control unit 22. Referring to an example of FIG. 7, the voltage detection unit 23 supplies to the write control unit 22 a signal for fixing a control terminal to a potential of an L level in order to keep the write transistor 3 in an off state (detail will be described later).

At the rise of the write voltage and the power supply voltage, a period of turning off the write transistor 3 is set according to a period till the above voltages are stabilized.

The level shifter 24 is connected to the terminal P1, VDD, earth terminal P2, and terminal P3 to which the write signal is supplied. For example, the level shifter 24 further boosts a write signal being a pulse signal for a fixed period of time from a signal level (e.g., approximately 1.2 V) of the power supply voltage to a signal level (e.g., approximately 2.4 V) of the write voltage. A thick gate oxide film (e.g., approximately 8 nm) is used in the write transistor 3 to which a relatively high write voltage is applied and a transistor (not illustrated) in the write control unit 22. Therefore, the above-described boost is performed in order to sufficiently turn on their transistors. In addition, a thick gate oxide film is used also in a transistor (not illustrated) of the voltage detection unit 23.

When a signal is unstable at the rise of the write voltage and the power supply voltage, the above-described write control circuit 21 can keep the write transistor 3 in an off state for a fixed period of time and suppress the false writing.

During the power-on of the write voltage, for example, when a write signal is boosted by the level shifter 24, it may also become an unstable signal by an unstable write voltage. However, the write control circuit 21 and the semiconductor device 20 of the present embodiment can keep the write transistor 3 in an off state regardless of the write signal for a fixed period of time during the power-on of the write voltage, and therefore suppress writing based on an unstable write signal.

Further, writing to the electrical fuse element 2 is suppressed due to an unstable write voltage during the power-on of the write voltage.

During the power-on of the power supply voltage, even if boost of the write signal becomes unstable and the unstable write signal is supplied to the write control unit 22, the write control circuit 21 can keep the write transistor 3 in an off state. Through the above processing, the write control circuit 21 can suppress the false writing due to an unstable write signal during the power-on of the power supply voltage.

Examples of the write control circuit according to fifth and sixth embodiments will be described in more detail below.

Fifth Embodiment

Figure 8:
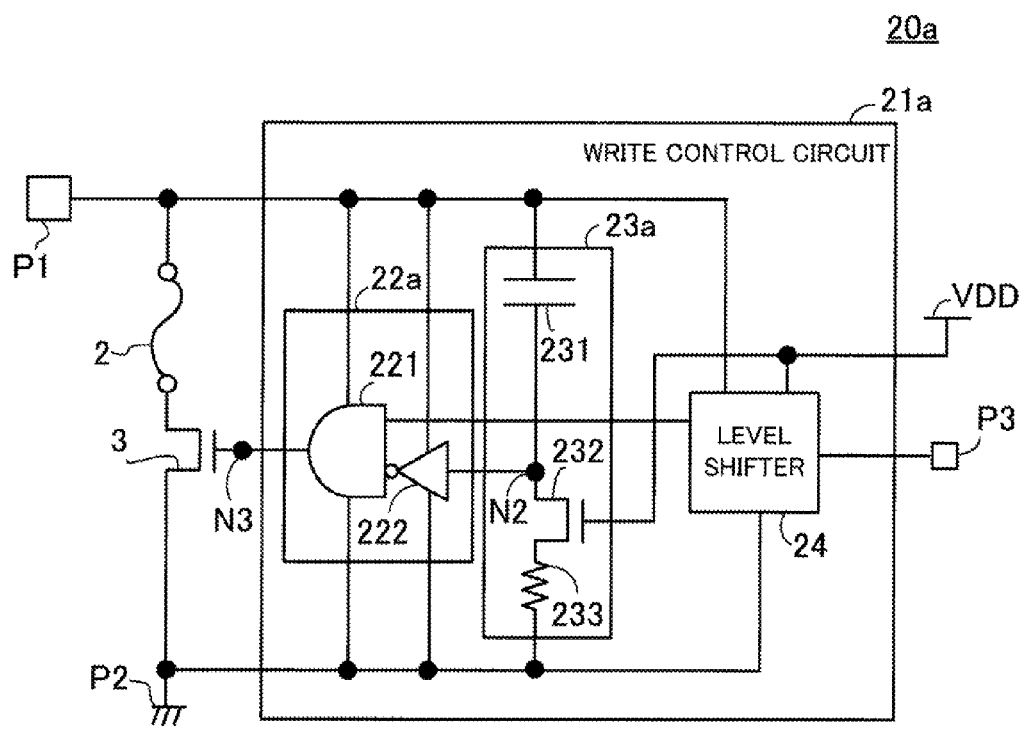
FIG. 8 illustrates one example of a semiconductor device and a write control circuit according to a fifth embodiment.

FIG. 8 illustrates one example of a semiconductor device and a write control circuit according to a fifth embodiment.

The same circuit elements as those of the semiconductor device 20 according to the fourth embodiment are indicated by the same reference numerals as in the fourth embodiment, and the description will not be repeated here.

In the semiconductor device 20a according to the fifth embodiment, a write control circuit 21a includes a write control unit 22a and a voltage detection unit 23a.

The write control unit 22a has an AND circuit 221 and an inverter circuit 222.

The AND circuit 221 outputs an AND logic between a write signal produced from the level shifter 24 and an output signal from the voltage detection unit 23a in which a signal level is inverted by the inverter circuit 222. The AND circuit 221 cancels out the write signal produced from the level shifter 24 by using a signal having an H level produced from the voltage detection unit 23a at the rise of the write voltage or the power supply voltage. That is, the AND circuit 221 outputs a signal having an L level regardless of the write signal.

The AND circuit 221 and the inverter circuit 222 are connected between the terminal P1 and the earth terminal P2, and driven by the write voltage, respectively.

The voltage detection unit 23a has a series circuit including a capacitor 231, a transistor 232, and a resistor 233 connected between the terminal P1 and the earth terminal P2.

One terminal of the capacitor 231 is connected to the terminal P1, and the other terminal is connected to one input and output terminal (drain) of the transistor (n channel MOSFET) 232. The other input and output terminal (source) of the transistor 232 is connected to one end of the resistor 233, and a control terminal (gate) is connected to the terminal VDD. The other end of the resistor 233 is connected to the earth terminal P2. A potential of a node N2 between the capacitor 231 and the drain of the transistor 232 is supplied to the inverter circuit 222 of the write control unit 22a as an output signal from the voltage detection unit 23a.

A capacitance value of the capacitor 231 and a resistance value of the resistor 233 are appropriately set according to a period of keeping the write transistor 3 in an off state during the power-on of the write voltage and the power supply voltage.

Operations of the semiconductor device 20a according to the fifth embodiment will be described below.

First, operations during the power-on of the write voltage in the case where the power supply voltage supplied from the terminal VDD is previously set (in a stable state) will be described.

Figure 9:
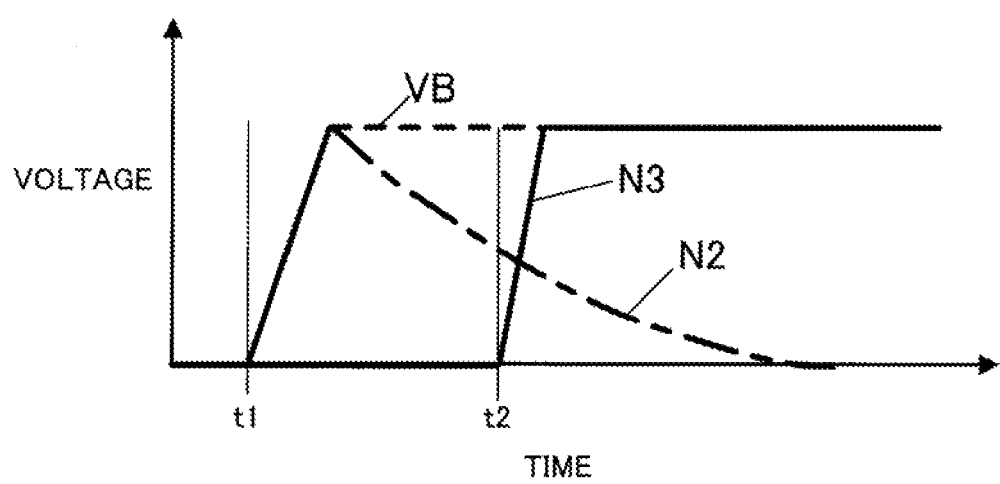
FIG. 9 illustrates one example of a signal waveform during power-on of a write voltage.

FIG. 9 illustrates one example of a signal waveform during the power-on of the write voltage.

The vertical axis represents the voltage, and the horizontal axis represents the time. In the figure, a write voltage supplied from the terminal P1 is described as a VB. Further, potentials of the nodes N2 and N3 of the semiconductor device 20a illustrated in FIG. 8 are described as N2 and N3, respectively.

In an initial state, a potential of the node N3 is assumed to have an L level. In the time t1, when power-on of the write voltage is started, a potential of the node N2 has an H level along with the rise of the write voltage. Therefore, an output signal from the inverter circuit 222 has an L level, an output signal from the AND circuit 221 has an L level regardless of the write signal produced from the level shifter 24, and a potential of the node N3 is fixed to an L level. Therefore, even if the write signal has an H level, the write transistor 3 is kept in an off state, and writing to the electrical fuse element 2 is prevented from occurring.

Since the power supply voltage is previously set (H level), the transistor 232 is kept in an on state. Therefore, a potential of the node N2 decreases with the time constant determined by a capacitance value of the capacitor 231 and a resistance value of the resistor 233.

When the potential of the node N2 is equal to or less than a potential (determined by the threshold voltage of a transistor of the inverter circuit 222) in which an input signal is determined to have an L level by the inverter circuit 222 (time t2), an output signal from the inverter circuit 222 is inverted to an H level. As a result, the AND circuit 221 outputs a value in response to the write signal produced from the level shifter 24. In the case where the write signal has an H level, the AND circuit 221 outputs a control signal having an H level, and a potential of the node N3 has an H level as illustrated in FIG. 9. Through the above processing, the write transistor 3 turns on, a current due to the write voltage flows through the electrical fuse element 2, and the break is performed.

As can be seen from the above discussion, during the power-on of the write voltage, the write transistor 3 is kept in an off state regardless of the write signal for a fixed period of time. Through the above processing, the write control circuit 21a can suppress writing to the electrical fuse element 2 due to an unstable write voltage or write signal. This process permits the write control circuit 21a to suppress the false writing.

Next, operations during power-on of the power supply voltage in the case where the write voltage supplied from the terminal P1 is previously set (in a stable state) will be described.

Figure 10:
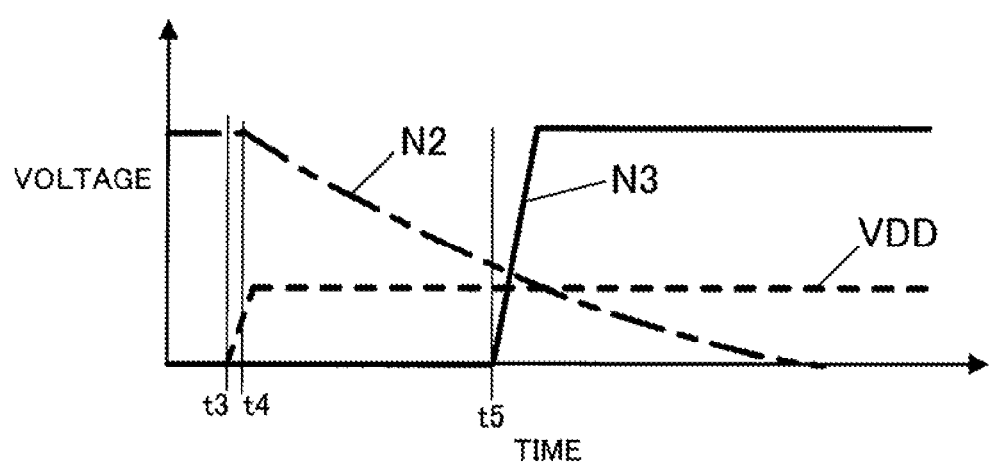
FIG. 10 illustrates one example of a signal waveform during power-on of a power supply voltage.

FIG. 10 illustrates one example of a signal waveform during the power-on of the power supply voltage.

The vertical axis represents the voltage, and the horizontal axis represents the time. In the figure, the power supply voltage supplied from the terminal VDD is described as a VDD. Further, potentials of the nodes N2 and N3 of the semiconductor device 20a illustrated in FIG. 8 are described as N2 and N3, respectively.

In an initial state, a potential of the node N3 is assumed to have an L level. At the time t3, when the power-on of the power supply voltage is started and it rises up to the threshold voltage of the transistor 232 (time t4), the transistor 232 turns on. As a result, a potential of the node N2 decreases with the time constant determined by a capacitance value of the capacitor 231 and a resistance value of the resistor 233. Note that an output signal from the inverter circuit 222 has an L level till a potential of the node N2 is equal to or less than a potential in which an input signal is determined to have an L level by the inverter circuit 222. Therefore, regardless of the write signal produced from the level shifter 24, an output signal from the AND circuit 221 has an L level and a potential of the node N3 is fixed to an L level. Therefore, even if the write signal has an H level, the write transistor 3 is kept in an off state and writing to the electrical fuse element 2 is prevented from occurring.

When a potential of the node N2 is equal to or less than a potential in which an input signal is determined to have an L level by the inverter circuit 222 (time t5), an output signal from the inverter circuit 222 is inverted to an H level. As a result, the AND circuit 221 outputs a value in response to the write signal produced from the level shifter 24. In the case where the write signal has an H level, the AND circuit 221 outputs a control signal having an H level and a potential of the node N3 has an H level as illustrated in FIG. 10. Through the above processing, the write transistor 3 turns on, a current due to the write voltage flows through the electrical fuse element 2, and the break is performed.

As can be seen from the above discussion, during the power-on of the power supply voltage, the write transistor 3 is kept in an off state regardless of the write signal for a fixed period of time. Through the above processing, the write control circuit 21a can suppress writing to the electrical fuse element 2 even if the write signal becomes unstable for that period. This process permits the write control circuit 21a to suppress the false writing.

Sixth Embodiment

Figure 11:
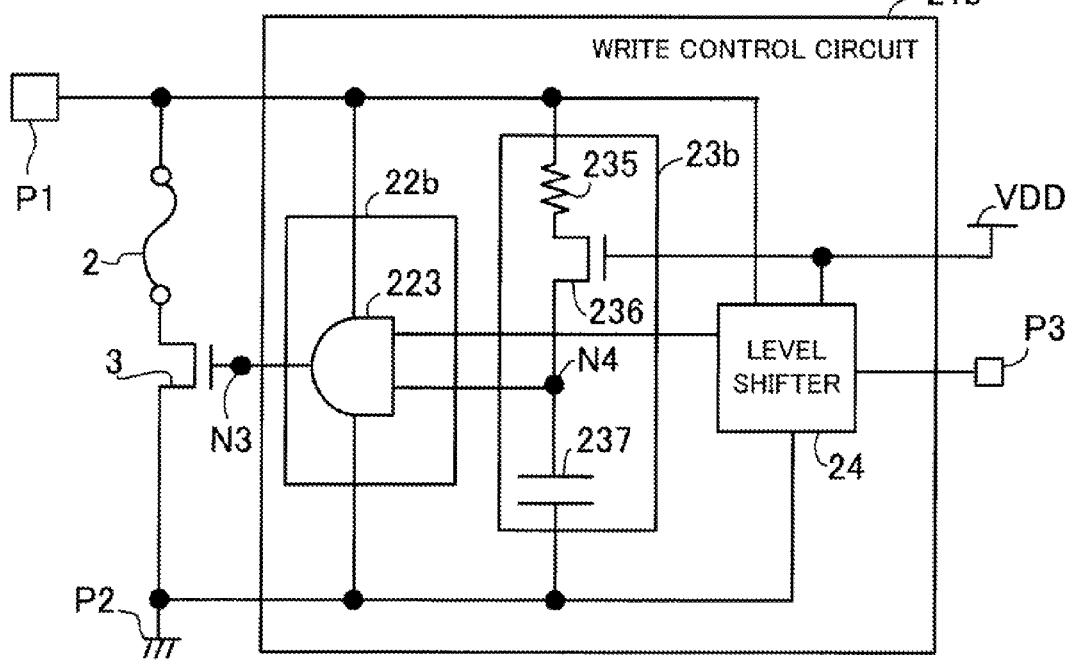
FIG. 11 illustrates one example of a semiconductor device and a write control circuit according to a sixth embodiment.

FIG. 11 illustrates one example of a semiconductor device and a write control circuit according to a sixth embodiment.

The same circuit elements as those of the semiconductor device 20a according to the fifth embodiment are indicated by the same reference numerals as in the fifth embodiment, and the description will not be repeated here.

In a semiconductor device 20b illustrated in FIG. 11, a voltage detection unit 23b of a write control circuit 21b differs from the voltage detection unit 23a of the write control circuit 21a according to the fifth embodiment in the connection among a resistor 235, a transistor 236, and a capacitor 237.

In the write control circuit 21b according to the sixth embodiment, the voltage detection unit 23b has a configuration in which one end of the resistor 235 is connected to the terminal P1 and the other end is connected to a drain of the transistor 236. A source of the transistor 236 is connected to one terminal of the capacitor 237, and the other end of the capacitor 237 is connected to the earth terminal P2. To a gate of the transistor 236, the terminal VDD is connected and the power supply voltage is supplied. A potential of the node N4 between a source of the transistor 236 and the capacitor 237 is supplied to the write control unit 22b as an output signal from the voltage detection unit 23b.

The write control unit 22b has an AND circuit 223, and receives an output signal from the voltage detection unit 23b and a boosted write signal produced from the level shifter 24. The write control unit 22b further outputs results of an AND logic operation between both the signals as a control signal to be supplied to a gate of the write transistor 3. The AND circuit 223 cancels out the write signal by using a signal produced from the voltage detection unit 23b for a fixed period of time at the rise of the write voltage or the power supply voltage. That is, the AND circuit 223 outputs a control signal having an L level regardless of the write signal.

Operations of the semiconductor device 20b will be described below.

First, operations during the power-on of the write voltage in the case where the power supply voltage supplied from the terminal VDD is previously set (in a stable state) will be described.

Figure 12:
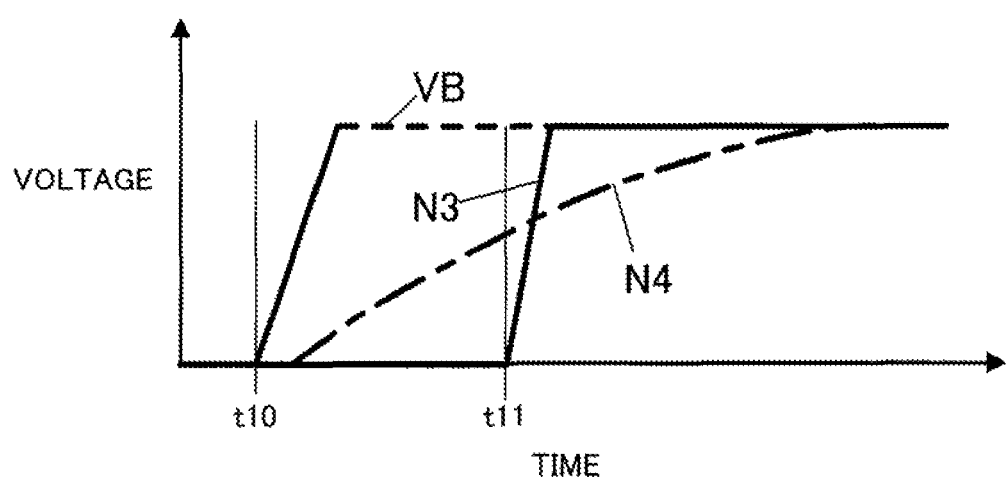
FIG. 12 illustrates one example of a signal waveform during power-on of a write voltage.

FIG. 12 illustrates one example of a signal waveform during the power-on of the write voltage.

The vertical axis represents the voltage, and the horizontal axis represents the time. In the figure, the write voltage supplied from the terminal P1 is described as a VB. Further, potentials of the nodes N3 and N4 of the semiconductor device 20b illustrated in FIG. 11 are described as N3 and N4, respectively.

In an initial state, a potential of the node N3 is assumed to have an L level. In the time t10, when the power-on of the write voltage is started, since the transistor 235 is kept in an on state, a potential of the node N4 also starts the rise with the time constant determined by a capacitance value of the capacitor 237 and a resistance value of the resistor 235 along with the rise of the write voltage. Note that till a potential of the node N4 is equal to or more than a potential (determined by the threshold voltage of a transistor of the AND circuit 223) in which an input signal is determined to have an H level by the AND circuit 223, an output signal from the AND circuit 223 still has an L level. Therefore, regardless of the write signal produced from the level shifter 24, an output signal from the AND circuit 223 has an L level and a potential of the node 3 is fixed to an L level. Therefore, even if the write signal has an H level, the write transistor 3 is kept in an off state, and writing to the electrical fuse element 2 is prevented from occurring.

When a potential of the node N4 is equal to or more than a potential in which an input signal is determined to have an H level by the AND circuit 223 (time t11), the AND circuit 223 outputs a value in response to the write signal produced from the level shifter 24. In the case where the write signal has an H level, the AND circuit 223 outputs a control signal having an H level, and a potential of the node N3 has an H level as illustrated in FIG. 12. Through the above processing, the write transistor 3 turns on, a current due to the write voltage flows through the electrical fuse element 2, and the break is performed.

As can be seen from the above discussion, during the power-on of the write voltage, the write transistor 3 is kept in an off state regardless of the write signal for a fixed period of time. Through the above processing, the write control circuit 21b can suppress writing to the electrical fuse element 2 due to an unstable write voltage or write signal. This process permits the write control circuit 21b to suppress the false writing.

Next, operations during the power-on of the power supply voltage in the case where the write voltage supplied from the terminal P1 is previously set (in a stable state) will be described.

Figure 13:
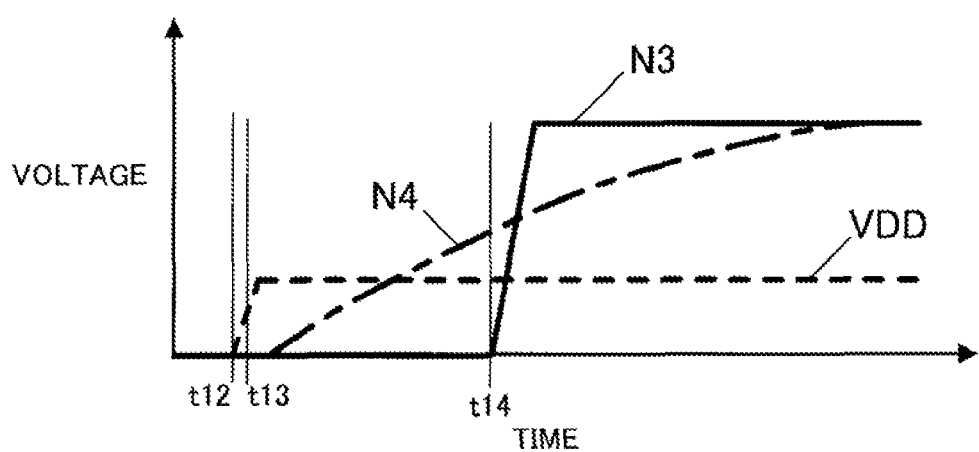
FIG. 13 illustrates one example of a signal waveform during power-on of a power supply voltage.

FIG. 13 illustrates one example of a signal waveform during the power-on of the power supply voltage.

The vertical axis represents the voltage, and the horizontal axis represents the time. In the figure, the power supply voltage supplied from the terminal VDD is described as a VDD. Further, potentials of the nodes N3 and N4 of the semiconductor device 20b illustrated in FIG. 11 are described as N3 and N4, respectively.

In an initial state, a potential of the node N3 is assumed to have an L level. At the time t12, when the power-on of the power supply voltage is started and it rises up to the threshold voltage of the transistor 236 (time t13), the transistor 236 turns on. Through the above processing, a potential of the node N4 increases with the time constant determined by a capacitance value of the capacitor 237 and a resistance value of the resistor 235.

Note that an output signal from the AND circuit 223 has an L level till a potential of the node N4 is equal to or more than a potential in which an input signal is determined to have an H level by the AND circuit 223. Therefore, regardless of the write signal produced from the level shifter 24, an output signal from the AND circuit 223 has an L level and a potential of the node N3 is fixed to an L level. In short, even if the write signal has an H level, the write transistor 3 is kept in an off state and writing to the electrical fuse element 2 is prevented from occurring.

When a potential of the node N4 is equal to or more than a potential in which an input signal is determined to have an H level by the AND circuit 223 (time t14), the AND circuit 223 outputs a value in response to the write signal produced from the level shifter 24. In the case where the write signal has an H level, the AND circuit 223 outputs a control signal having an H level and a potential of the node N3 has an H level as illustrated in FIG. 13. Through the above processing, the write transistor 3 turns on, a current due to the write voltage flows through the electrical fuse element 2, and the break is performed.

As can be seen from the above discussion, during the power-on of the power supply voltage, the write transistor 3 is kept in an off state regardless of the write signal for a fixed period of time. Through the above processing, the write control circuit 21b can suppress writing to the electrical fuse element 2 even if the write signal becomes unstable for that period. This process permits the write control circuit 21b to suppress the false writing.

In the seventh embodiment, an example where the above-described write control circuit is applied, for example, at the time of realizing identification (ID) which identifies a chip will be described below.

Seventh Embodiment

Figure 14:
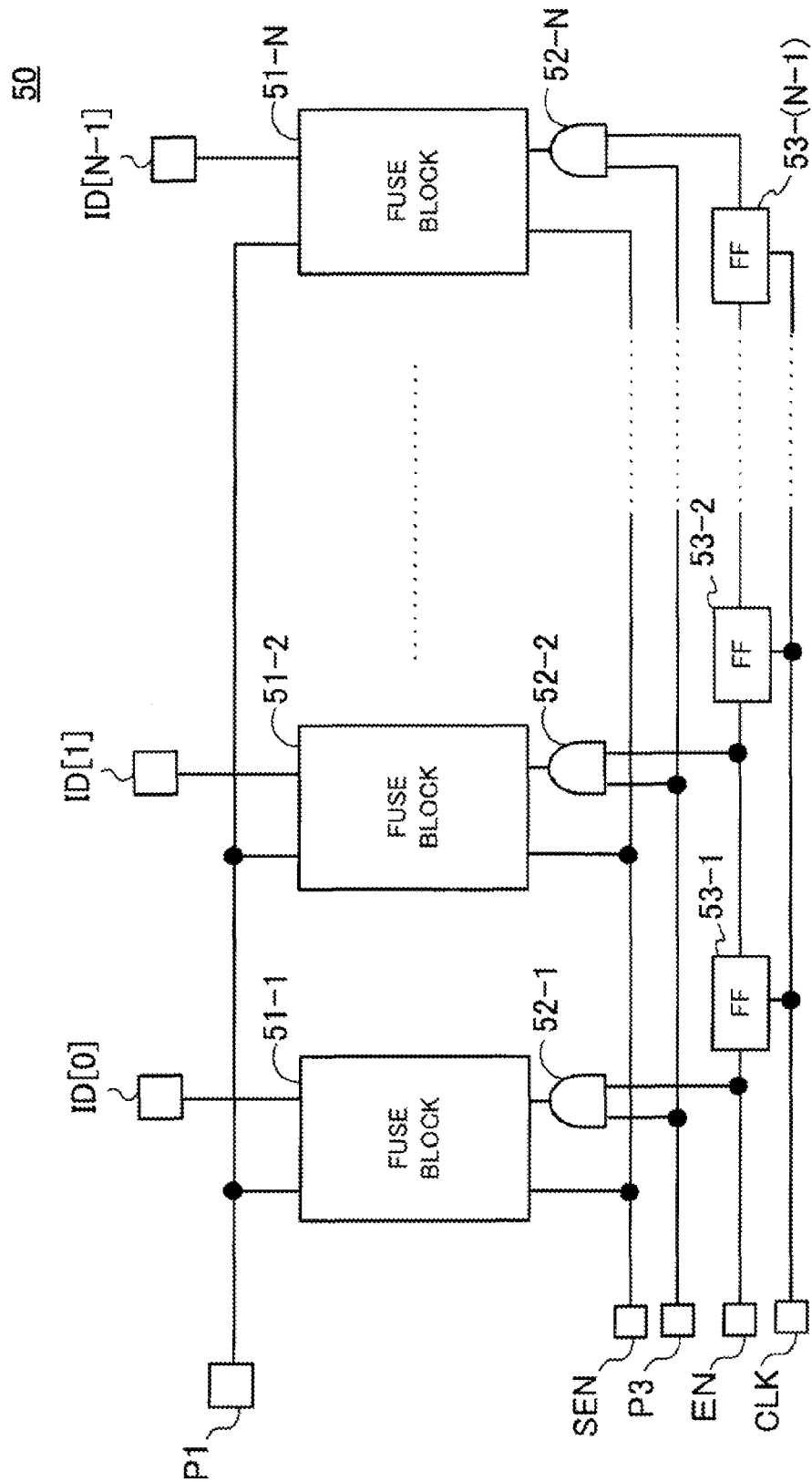
FIG. 14 illustrates one example of a semiconductor device according to a seventh embodiment.

FIG. 14 illustrates one example of a semiconductor device according to a seventh embodiment.

The semiconductor device 50 includes multiple fuse blocks 51-1, 51-2, . . . , and 51-N, AND circuits 52-1, 52-2, . . . , and 52-N, and flip-flops 53-1, 53-2, . . . , and 53-(N−1).

To each of the fuse blocks 51-1 to 51-N, the write voltage is supplied from the terminal P1. Further, from a terminal SEN, a read signal (sense signal) for instructing reading is supplied to the fuse blocks 51-1 to 51-N. Further, a write signal supplied from the terminal P3 and an enable signal supplied from a terminal EN are supplied to the AND circuits 52-1 to 52-N. An output signal from the AND circuits 52-1 to 52-N is supplied to the fuse blocks 51-1 to 51-N.

The flip-flops 53-1 to 53-(N−1) each have a function of a shift resister for taking in an enable signal and shifting it to the post-stage in response to a clock signal supplied from a terminal CLK.

Figure 15:
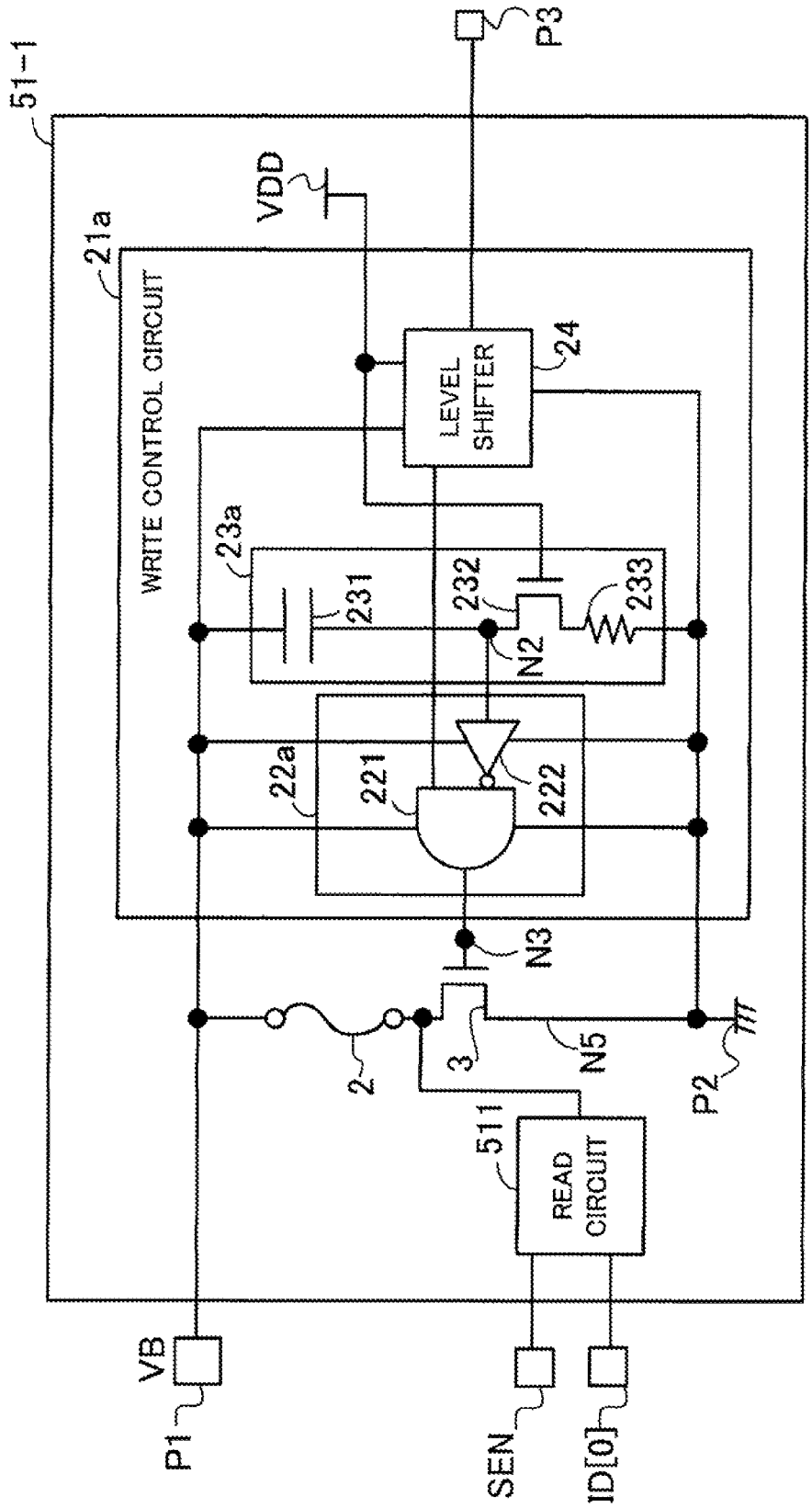
FIG. 15 illustrates one example of a fuse block.

FIG. 15 illustrates one example of the fuse block.

In FIG. 15, one example of the fuse block 51-1 illustrated in FIG. 14 is illustrated. Much the same is true on the other fuse blocks 51-2 to 51-N. The same circuit elements as those of the semiconductor device 20a illustrated in FIG. 8 are indicated by the same reference numerals as in the semiconductor device 20a.

The fuse block 51-1 includes a read circuit 511 in addition to respective circuit elements of the semiconductor device 20a illustrated in FIG. 8.

When receiving a sense signal to be instructed to perform reading from the SEN terminal, the read circuit 511 reads a potential (potential of the node N5 in FIG. 15) on the cathode side of the electrical fuse element 2, and outputs the read potential from an output terminal ID [0].

During the writing, in the semiconductor device 50 as illustrated in FIGS. 14 and 15, in a state where the write voltage is applied to the terminal P1, any one of the fuse blocks 51-1 to 51-N for performing the writing is selected according to an enable signal, write signal, and clock signal, and the break is performed. Through the above processing, for example, a chip ID is programmed based on the fact that the break is performed in which of the fuse blocks 51-1 to 51-N.

When receiving a sense signal for reading written contents of the fuse blocks 51-1 to 51-N from the terminal SEN, the read circuit 511 of each of the fuse blocks 51-1 to 51-N reads a potential of the node N3 according to a state of the electrical fuse element 2. The read potential is produced, for example, as a chip ID from the output terminals ID [0], ID [1], . . . , and ID [N−1].

The write control circuit 10a according to the fifth embodiment is mounted on each of the fuse blocks 51-1 to 51-N of the above-described semiconductor device 50. This process permits the write control circuit 10a to prevent false writing of the chip ID.

In FIG. 15, an example where the write control circuit 21a illustrated in FIG. 8 is applied is described; however, it is not limited thereto. For example, the write control circuit 21b illustrated in FIG. 11 may be used.

Further, as the write transistor 3 and the transistors 232 and 236, a p channel MOSFET may be used. In that case, a circuit configuration is appropriately changed. Further, in place of the MOSFET, a bipolar transistor may be used.

As can be seen from various embodiments discussed above, the disclosed write control circuit and semiconductor device permit false writing to be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions and alterations could be made hereto without departing from the spirit and scope of the invention.

What is claimed is:

1. A write control circuit comprising:
a write control unit configured to control writing to a storage element in which only single writing is electrically performed, according to a write signal which enables or disables writing to the storage element; and
a voltage detection unit configured to detect a write voltage supplied to the storage element, and when the write voltage is equal to or more than a predetermined threshold voltage, send the write control unit a control signal to stop writing;
wherein the write control unit stops writing to the storage element regardless of the write signal, when the write control unit receives the control signal from the voltage detection unit.

2. The write control circuit according to claim 1,
wherein the write control unit has a logical circuit which cancels out the write signal by a signal produced from the voltage detection unit when the write voltage is equal to or more than the threshold voltage.

3. The write control circuit according to claim 1,
wherein the voltage detection unit has multiple series-connected diodes between an earth terminal and a terminal to which the write voltage is applied, and the threshold voltage is set based on the number of the diodes and a forward voltage.

4. The write control circuit according to claim 3,
wherein the voltage detection unit has a transistor which is connected between the earth terminal and a terminal to which the write voltage is applied, connects a control terminal between the multiple diodes, and supplies a signal for canceling out the write signal from one input and output terminal to the write control unit.

5. The write control circuit according to claim 1,
wherein the voltage detection unit has a threshold voltage generation circuit which generates the threshold voltage, and a comparison circuit which compares the write voltage and the threshold voltage and, when the write voltage is equal to or more than the threshold voltage, supplies a signal for canceling out the write signal to the write control unit.

6. A write control circuit comprising:
a write control unit configured to control writing to a storage element in which only single writing is electrically performed, according to a write signal which enables or disables writing to the storage element; and
a voltage detection unit configured to send the write control unit a control signal to stop writing for a certain fixed period at the rising of a power supply voltage or a write voltage supplied to the storage element;
wherein the write control unit stops writing to the storage element regardless of the write signal, when the write control unit receives the control signal from the voltage detection unit.

7. The write control circuit according to claim 6,
wherein the write control unit has a logical circuit which cancels out the write signal by a signal produced from the voltage detection unit at the rising of the power supply voltage or the write voltage.

8. The write control circuit according to claim 6,
wherein:
the voltage detection unit has a series circuit including a resistor, capacitor, and transistor in which the power supply voltage is applied to a control terminal, connected between an earth terminal and a terminal to which the write voltage is applied; and
supplies a signal of a node between the transistor and the capacitor to the write control unit, and allows the write control unit to stop writing to the storage element at the rising of the power supply voltage or the write voltage.

9. The write control circuit according to claim 6,
wherein the write signal is a signal boosted to a signal level of the write voltage from a signal level of the power supply voltage by a level shifter.

10. The write control circuit according to claim 8,
wherein based on a time constant of the series circuit and a threshold voltage in a transistor of the write control unit, the certain fixed period is set.

11. A semiconductor device comprising:
a storage element configured to perform electrically only single writing;
a write transistor configured to be connected to the storage element and control according to a first control signal whether to flow a current due to a write voltage through the storage element;
a write control unit configured to output the first control signal according to a write signal and control writing to the storage element; and
a voltage detection unit configured to detect the write voltage and, when the write voltage is equal to or more than a predetermined threshold voltage, send the write control unit a second control signal to stop writing, or configured to send the write control unit the second control signal to stop writing for a certain fixed period at the rising of a power supply voltage or the write voltage;
wherein the write control unit stops writing to the storage element regardless of the write signal, when the write control unit receives the second control signal from the voltage detection unit.

* * * * *